United States Patent
Fujimori et al.

(10) Patent No.: US 7,608,857 B2
(45) Date of Patent: Oct. 27, 2009

(54) FIELD EFFECT TRANSISTOR HAVING A STRUCTURE IN WHICH AN ORGANIC SEMICONDUCTOR THAT FORMS A CHANNEL IS MADE OF A SINGLE CRYSTAL OR A POLYCRYSTAL OF ORGANIC MOLECULES

(75) Inventors: Masaaki Fujimori, Hatoyama (JP); Tomihiro Hashizume, Hatoyama (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 211 days.

(21) Appl. No.: 11/602,404

(22) Filed: Nov. 21, 2006

(65) Prior Publication Data

US 2007/0117298 A1 May 24, 2007

(30) Foreign Application Priority Data

Nov. 22, 2005 (JP) ............................ 2005-336709

(51) Int. Cl.
*H01L 31/036* (2006.01)
(52) U.S. Cl. ............. 257/64; 257/E21.036; 257/21.409
(58) Field of Classification Search ................. 438/198; 257/213–224, E21.133, 64, E21.036, E21.409
See application file for complete search history.

(56) References Cited

U.S. PATENT DOCUMENTS

| 7,208,763 | B2 * | 4/2007 | Koyama | 257/66 |
| 2004/0077132 | A1 * | 4/2004 | Lee | 438/149 |
| 2006/0110847 | A1 | 5/2006 | Fujimori et al. | |
| 2007/0018151 | A1 * | 1/2007 | Sirringhaus et al. | 257/40 |

OTHER PUBLICATIONS

Vikram C. Sundar et al., "Elastomeric Transistor Stamps: Reversible Probing of Charge Transport in Organic Crystals", Science, vol. 303, Mar. 12, 2004, pp. 1644-1646.
Oana D. Jurchescu et al., "Effect of Impurities on the Mobility of Single Crystal Pentacene", Applied Physics Letters, vol. 84, No. 16, Apr. 19, 2004, pp. 3061-3063.
A. R. Brown et al., "Precursor Route Pentacene Metal-Insulator-Semiconductor Field-Effect Transistors", J. Appl. Phys., vol. 79, N. 4, Feb. 15, 1996, pp. 2136-2138.
Ali Afzali et al., "High-Performance, Solution-Processed Organic Thin Film Transistors from a Novel Pentacene Precursor", J. Am. Chem. Soc., vol. 124, Apr. 24, 2002, pp. 8812-8813.
Takashi Minakata et al., "Direct formation of Pentacene Thin Films by Solution Process", Science Direct, Synthetic Metals, vol. 153 (2005), pp. 1-4.
Mika Nagano, et al., "The First Observation of $^1$H-NMR Spectrum of Pentacene", Japanese Journal of Applied Physics, vol. 43, No. 2B (2003), pp. L315-L316.

* cited by examiner

*Primary Examiner*—Khiem D Nguyen
(74) *Attorney, Agent, or Firm*—Stites & Harbison, PLLC; Juan Carlos A. Marquez, Esq.

(57) ABSTRACT

A TFT having a large mobility of carriers that are conducted through a channel as compared with a conventional organic TFT, and a method of manufacturing the TFT inexpensively and easily are provided. The channel is formed of a semiconductor organic molecular crystal thin film which is highly oriented, and a TFT that is large in the mobility of the carriers that are conducted through the channel, and a lyophilic TFT pattern that is surrounded by a lyophobic region on a substrate are formed, and the configuration of the pattern is featured, whereby a solution of the semiconductor organic molecules which is supplied to an appropriate region of a substrate surface including the channel is spontaneously dried in an anisotropic fashion, and highly oriented crystal is grown in the drying process.

4 Claims, 10 Drawing Sheets

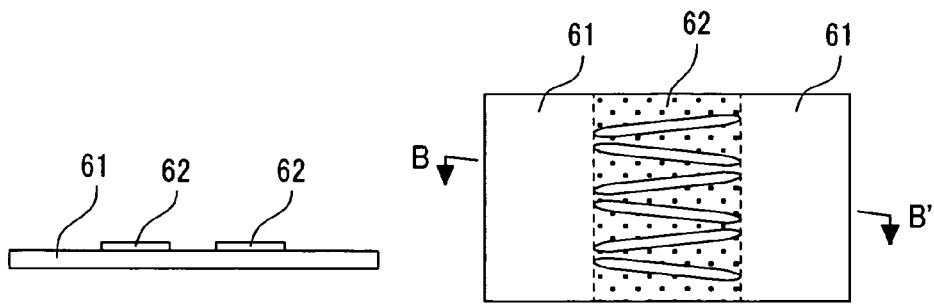
FIG.6A
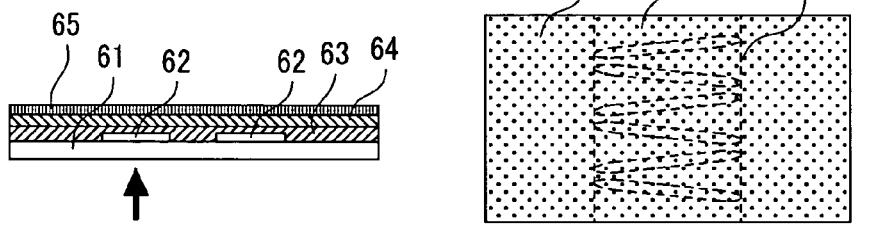
FIG.6B
FIG.6C
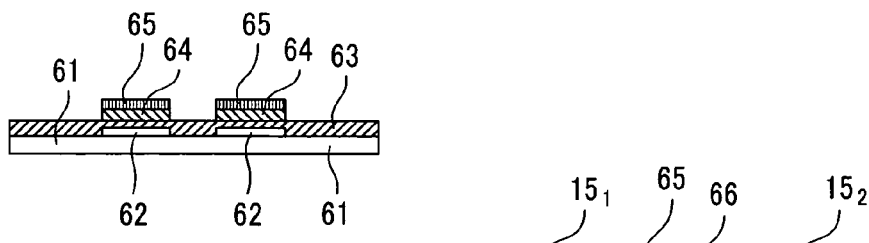
FIG.6D
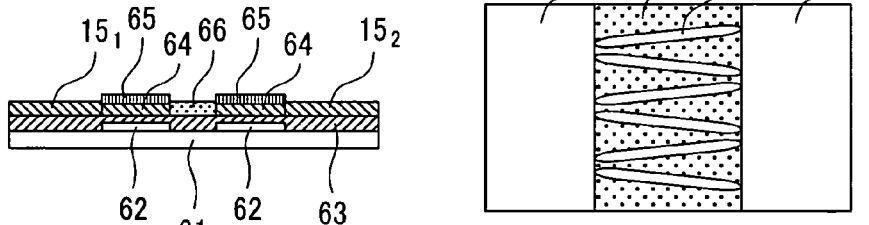
FIG.6E
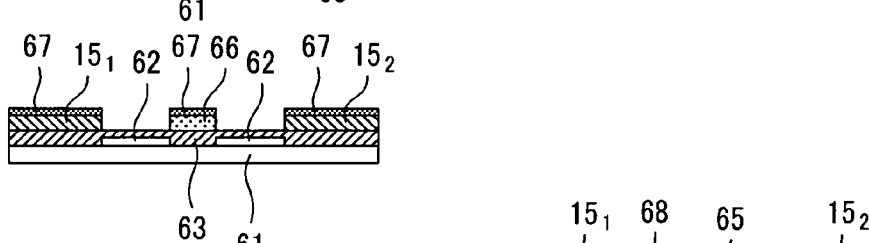
FIG.6F
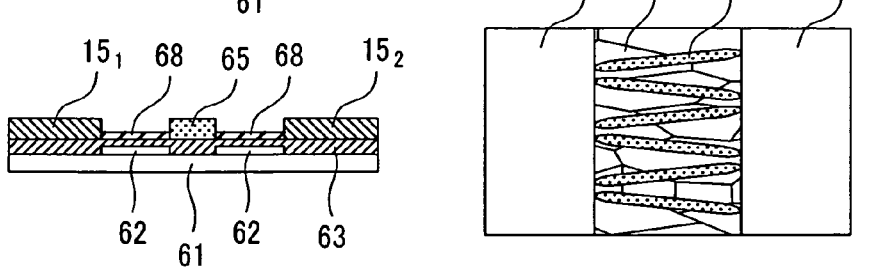

FIELD EFFECT TRANSISTOR HAVING A STRUCTURE IN WHICH AN ORGANIC SEMICONDUCTOR THAT FORMS A CHANNEL IS MADE OF A SINGLE CRYSTAL OR A POLYCRYSTAL OF ORGANIC MOLECULES

CLAIM OF PRIORITY

The present application claims priority from Japanese Application JP2005-336709 filed on Nov. 22, 2005, the content of which is hereby incorporated by reference into this application.

BACKGROUND OF THE INVENTION

1. Field of the Invention

The present invention relates to a thin film transistor using an organic semiconductor and a method of manufacturing the thin film transistor, and more particularly to a transistor having a structure in which an organic semiconductor that forms a channel is made of a single crystal or a polycrystal of organic molecules, and having a structure in which the orientation of the single crystal is directed to a specific direction with respect to a direction that connects electrodes on both ends of the channel to each other, or having a structure in which grains that constitute the polycrystal are arranged in a specific direction with respect to a direction that connects the electrodes on both ends of the channel to each other, and a method of manufacturing the transistor.

2. Description of the Related Art

In a flat-screen display device using a liquid crystal or organic electro luminescence element, there is used a thin film transistor (TFT) using an amorphous silicon or a polycrystalline silicon for a channel as an element that drives a pixel. On the other hand, in the display device using the organic EL for the pixel, study has been widely conducted in which a TFT which is used in a driver circuit is intended to be also made of an organic material in order to realize a flexible display device or reduce the manufacturing costs. Because the TFT that is made of amorphous silicon or polycrystal silicon is not flexible, it is impossible to make the display device using those TFTs flexible. Also, the manufacturing costs become high because vacuum equipments are used in the manufacturing process. If it is possible that the TFT can be made of an organic material, the flexible display device can be realized. Also, the display device can be manufactured through a so-called wet process such as a printing technology depending on an organic material to be used, and no vacuum equipment is required for manufacturing, and therefore a reduction in the manufacturing costs can be also realized.

The organic molecules are roughly classified into organic molecules that are low in the molecular weight (low-molecular-weight organic molecules) such as a monomer or an oligomer, and organic molecules that are high in the molecular weight (high-molecular-weight organic molecules) such as a polymer. The TFT (organic TFT) having a channel made of the organic molecules can be also roughly classified into two kinds of TFTs according to the type of molecules of which the channel is made up. It is proved that organic TFT that uses the low-molecular-weight organic molecules for the channel is capable of increasing the mobility of carriers that flow in the channel to the same degree as that of the amorphous silicon when organic TFT is capable of excellently keeping the crystallinity of the organic molecules, and such an organic TFT has the feature that a TFT which is high in the operating speed as the organic TFT is readily obtained. However, because vacuum deposition of the organic molecule is generally employed in the formation of the channel, there is an advantage in that it is difficult to reduce the manufacture costs. On the other hand, the organic TFT that uses the high-molecular-weight organic molecules as the channel is capable of reducing the manufacture costs because it is easy to apply the wet process to the manufacture. However, the mobility of the carriers that flow in the channel can only be realized about $\frac{1}{10}$ the amount of that of the organic TFT that uses the low-molecular-weight organic molecules for the channel, and there is a disadvantage in that the performance of the TFT is low.

In general, in the case of using the organic molecules for the channel, there arises such a problem that the operation speed of the TFT is lower than that of the TFT of silicon. This problem is caused by the fact that the mobility of the carriers that flow in the channel is small, and there has been known that one of the large causes is the scattering of the carriers within the channel. In order to reduce the scattering of the carriers, there has been widely conducted that, in the case of the low-molecular-weight organic molecules, the size of grains of crystals of forming the channel are increased and the number of grain boundaries are reduced, through which the carries pass through when the carriers are conducted between electrodes at both ends of the channel. To use the single crystal for the channel is most desirable because the influence of the grain boundaries can be removed. In the case of high-molecular-weight organic molecules, it is general that the high-molecular-weight organic molecules are extended in parallel with the conduction direction of the carriers that flow in the channel as much as possible, to thereby reduce the scattering of the carries within the high-molecular-weight organic molecules.

In order to realize the flexible display device, it is necessary to provide the flexibility including a peripheral circuit that drives the pixels. The carrier mobility of about 1 $cm^2/V \cdot s$ or more is required for the TFT that is used in the circuit which drives the pixel, but the organic TFT that has been proved to satisfy the above requirement under the circumstances is only the TFT that uses the low-molecular-weight organic molecules for the channel. For example, in Science, Vol. 303, page 1644 (2004), the carrier mobility of 15 ($cm^2/V \cdot s$) is obtained in the organic TFT that uses single crystal of rubrene molecules for the channel. Also, in Applied Physics Letters, Vol. 84, page 3061 (2004), there has been reported the carrier mobility of 35 ($cm^2/Vs$) at a room temperature with respect to the single crystal of pentacene molecules which have been highly purified. However, the above high mobility is applied to the single crystal specimen, and obtained by paying specific attention to the manufacture of the single crystal and the TFT specimen. In the case where the low-molecular-weight organic molecules are used for the channel, it is more general to use thin-film crystal of the organic molecules that have been produced by vacuum deposition. However, this method makes it difficult to form the single crystal for the channel; and is disadvantageous in the costs or the mass productivity because vacuum is applied.

The above organic TFT suffers from such a problem that the TFT cannot perform both of the performance that is required from the application side and the costs and productivity which are required from the viewpoint of the productivity. In other words, it is general that the organic TFT which consists of low-molecular-weight organic molecules which is liable to enhance the performance of the TFT is manufactured by the aid of vacuum deposition, and therefore disadvantageous in the viewpoint of manufacture. On the other hand, the organic TFT that is made of the high-molecular-weight organic molecules which is liable to suppress the manufacture costs is remarkably low in the performance of the TFT, and can be therefore applied to nothing other than the limited intended purposes.

As means for solving the above problem, there is a method of dissolving the low-molecular-weight organic molecules in a solvent and coating the solution to form a semiconductor layer of the channel. As to pentacene that is most typical organic molecules as an applied example of the low-molecular-weight organic molecules to the TFT, for example, Journal of Applied Physics, Vol. 79, page 2136 (1996), and Journal of American Chemical Society, Vol. 124, page 8812 (2002) have reported a technique by which precursors of pentacene molecules are synthesized, and a thin film is formed by using a solution that increases the solubility with respect to the solvent. Also, Synthetic Metals, Vol. 153, page 1 (2005) discloses a technique by which the pentacene molecules are directly solved in the solvent, and coated to form a thin film. In addition, Applied Physics letters, Vol. 84, page 3061 (2004) and Japanese Journal of Applied Physics, Vol. 43, No. 2B, page L315 (2004) disclose a procedure of solving pentacene molecules in the organic solvent.

Those techniques make it possible to form the low-molecular-weight organic molecules by coating by using no vacuum apparatus, and possibilities of realizing the required performance at the low costs may be opened.

SUMMARY OF THE INVENTION

However, all of the above problems cannot be solved by the above coating technique. In other words, in the case of forming the semiconductor layer by coating, it is impossible to form the TFT on an arbitrary region over a substrate with using nothing other than the conventional art disclosed in Journal of Applied Physics, Vol. 79, page 2136 (1996), Journal of American Chemical Society, Vol. 124, page 8812 (2002), or Synthetic Metals, Vol. 153, page 1 (2005) because there is no provision of a technique that limits a region on which the solution is coated. Also, it has not been possible to control the size or orientation of the grains of the formed semiconductor. Therefore, it is difficult to improve the device characteristic of the TFT and the uniformity of the characteristics in the respective devices as well as the reliability.

The present invention has been made in view of the above problems, and therefore an object of the present invention is to provide a TFT that is made of semiconductor organic molecular crystals whose specific crystal orientation is oriented in a conduction direction of carriers which flow in a channel, or has a channel layer in which a grain size largely grows in the carrier movement direction.

To achieve the above object, the present invention uses a solution in which a semiconductor organic molecule is dissolved, a crystal of the semiconductor organic molecule is formed at a position in a channel of a TFT by controlling the orientation and the grain size, the TFT is provided, that is made of semiconductor organic molecular crystal whose specific crystal orientation is oriented in a conduction direction of carriers which flow in a channel, or has a channel layer in which a grain size largely grows in the carrier movement direction.

According to an aspect of the present invention, semiconductor organic molecule solution on the substrate is dried anisotropcally by using a pattern of a type which is given to the substrate, thereby making it possible to control the growth direction or orientation of the grains that form the organic molecular crystal thin film which grows from the solution. As a result, it is possible to improve the mobility of carriers that flow in the channel. In the case where the semiconductor organic molecular crystal is made to grow from the liquid, in order to realize the control of the orientation of crystal or the growth direction inexpensively, it is necessary to control the drying process of the solution in which the semiconductor organic molecules are solved. In order to achieve this object inexpensively, it is most realistic to use a pattern that is given to the substrate. Through the above method, it is possible to inexpensively and readily form plural organic TFTs that are large in the carrier mobility on the same substrate through a printing process including a coating method or an ink jet method.

BRIEF DESCRIPTION OF THE DRAWINGS

These and other objects and advantages of this invention will become more fully apparent from the following detailed description taken with the accompanying drawings in which:

FIGS. 6A, 6B, 6C, 6D, 6E, and 6F are illustrations showing a formation process of a TFT according to the present invention in the case where the TFT is manufactured by using a printing method and a coating method using flexible materials for a substrate and/or an insulating film.

DETAILED DESCRIPTION OF THE PREFERRED EMBODIMENTS

Now, a description will be given in more detail of preferred embodiments of the present invention with reference to the accompanying drawings.

First Embodiment

Figure 1A:
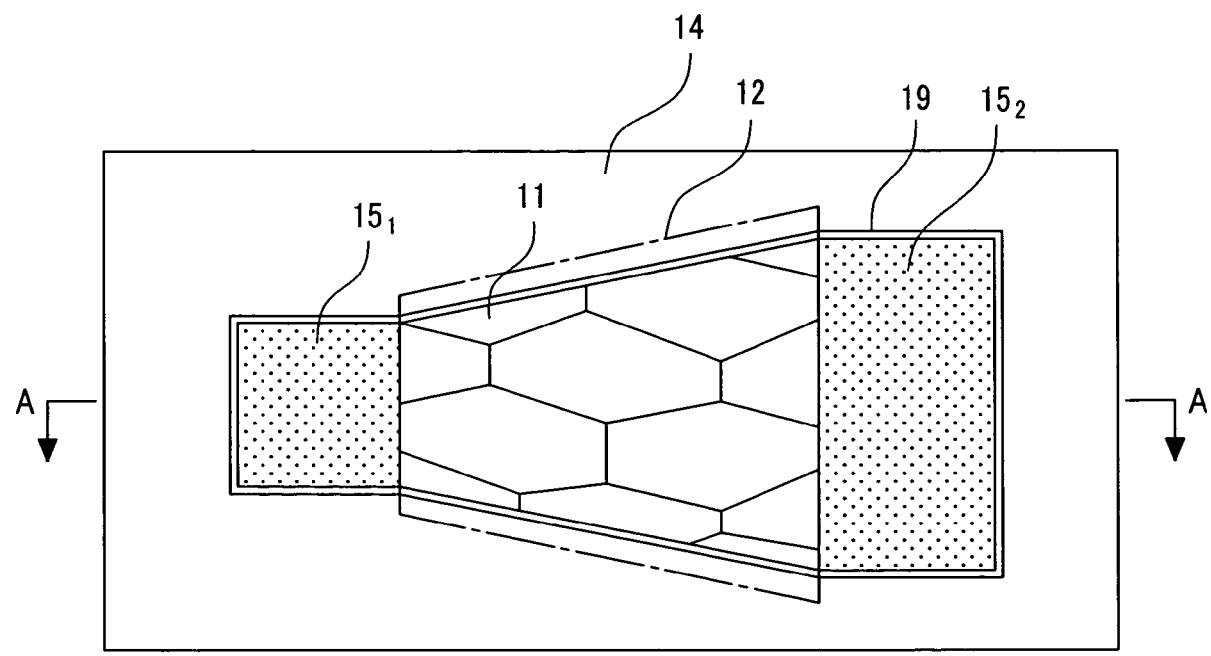
FIG. 1A is a plan showing a typical structure of a TFT formed according to the present invention.

FIG. 1A is a plan schematically showing the structure of a TFT according to a first embodiment of the present invention.

Figure 1B:
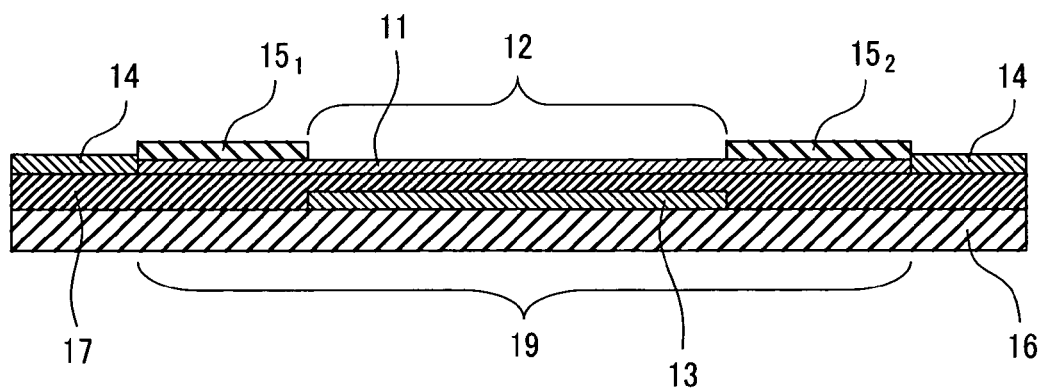
FIG. 1B is a cross-sectional view taken along an arrow direction at a position A-A of FIG. 1A.

FIG. 1B is a cross-sectional view taken along an arrow direction at a position A-A of FIG. 1A.

Referring to FIG. 1A, reference numeral $15_1$ and $15_2$ denote source and drain electrodes, respectively. Reference numeral 11 is a semiconductor organic molecular crystal thin film that consists of highly oriented grains and constitutes a channel region 12 of the TFT. Reference numeral 14 is a region that is high in the solution lyophobic property, and reference numeral 19 is a lyophilic region (a region that is low in the lyophilicity). The present invention defines a drying direction of the semiconductor organic molecule solution that is supplied to the lyophilic region 19, and controls the orientation and grain size of the growing crystal by using a pattern of the lyophilic region 19 within a region surrounded by the lyophobic region 14 as will be described later. Therefore, a portion of the source and drain electrodes $15_1$, $15_2$, and the semiconductor organic molecular crystal thin film 11 coincides with a region of the lyophilic region 19, but in the drawing, the lyophilic region 19 is slightly largely indicated for facilitation of understanding the lyophilic region 19.

Referring to FIG. 1B, reference numeral 16 denotes a substrate, and after a gate electrode 13 has been formed on an upper surface of the substrate 16, an insulating film 17 is formed on the gate electrode 13. The lyophobic region 14 and the lyophilic region 19 which have been described with reference to FIG. 1A are formed on the insulating film 17. The lyophilic region 19 is positioned at a position corresponding to the gate electrode 13. After a semiconductor organic molecular thin film that is oriented to the channel 12 has been formed by using the lyophilic region 19, the source and drain electrodes $15_1$ and $15_2$ are formed. The procedure described in this example will be described in more detail later.

The present invention is characterized in that the width of the channel 12 that connects the source and drain electrodes $15_1$ and $15_2$ changes from one electrode toward the other electrode.

FIGS. 2A to 2E are diagrams for explaining a growing process of a highly oriented crystal through an anisotropic drying process of solution including semiconductor organic molecules in the present invention.

Figure 2A:
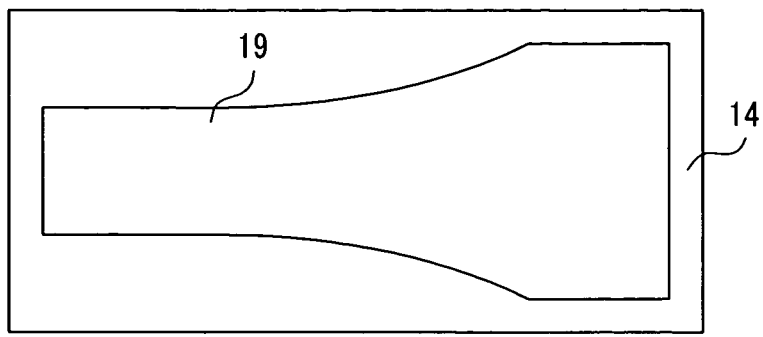
FIGS. 2A, 2B, 2C, 2D and 2E are illustrations schematically showing a process of growing a highly oriented semiconductor organic molecular crystal thin film from a solution by spontaneously inducing the orientation of crystal by the anisotropic drying of a semiconductor organic molecule solution in the present invention.

As shown in FIG. 2A, a surface that surrounds the lyophilic region 19 forming the TFT pattern by the lyophobic region 14 is prepared. The channel 12 and the source and drain electrode portions at both sides of the channel 12 are formed in the lyophilic region 19.

Figure 2B:
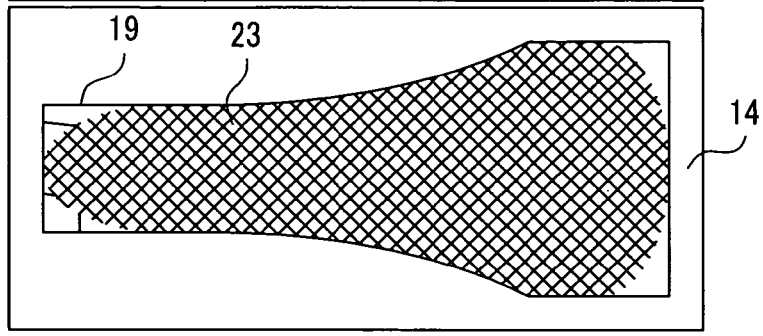

As shown in FIG. 2B, a solution 23 in which the semiconductor organic molecules are dissolved is supplied to the lyophilic region 19 by means of a jetting mechanism. The jetting mechanism may be formed of, for example, a member having a thin-diameter hole at a leading end thereof such as a dropper or a micropipette, a member using a metal needle, or an ink jetting head of an ink jet printer. It is desirable to provide the jetting mechanism with a mechanism that controls a jetting mechanism and a mechanism that controls the amount of jetting solution. It is possible to supply the solution onto the substrate by immersing the entire substrate into the solution without using the jetting mechanism, depending on the solution to be used and a difference in the lyophobic property between the lyophobic region and the lyophilic region. The supplied solution 23 accumulates in the lyophilic region 19 that forms the TFT pattern because the peripheral portion of the lyophilic region 19 is formed by the lyophobic region 14. The lyophobic region 14 and the lyophilic region 19 can be formed through a known method. In addition, it is preferable that a step is formed so that the lyophilic region 19 becomes lower than the peripheral portion, and the peripheral portion is processed as the lyophobic region.

Figure 2C:
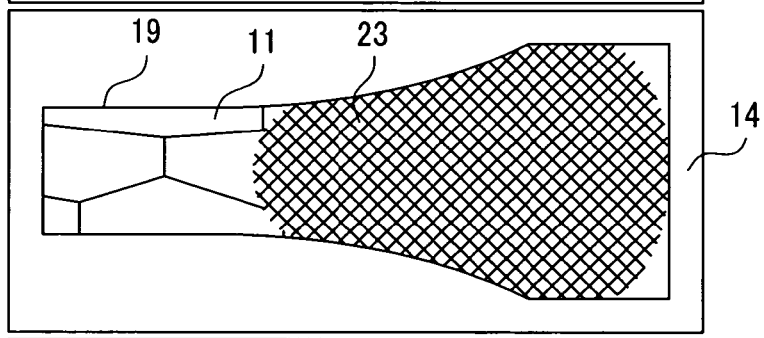

As shown in FIG. 2C, the amount of solution 23 that is supplied to the lyophilic region 19 is reduced by drying, and drying starts from a region that is narrower in the width, and the solution remains in a region that is wider in the width. This phenomenon is caused by a property that deforms the configuration so that a fluid minimizes a surface energy. In other words, because the surface energy when the supplied fluid exists in one region of the lyophilic region which is wider in the width is smaller than the surface energy when the supplied fluid exists in another region that is narrower in the width, the residual liquid naturally remains in the region that is wider in the width, and the drying starts from the region that is narrower in the width. The crystal of the semiconductor organic molecules grows from the solution that dries from the region that is narrower in the width. The drying gradually develops from the region that is narrower in the width toward the wider region, with which crystal grows. It is necessary that the width of the lyophilic pattern changes with respect to any direction of the channel so that the drying develops from one end of the lyophilic pattern and naturally reaches another end.

Figure 2D:
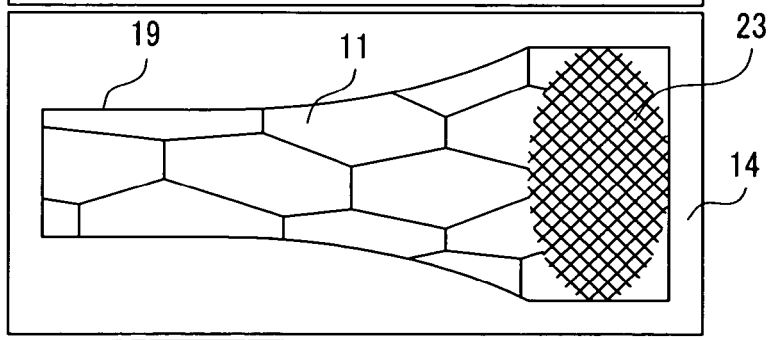

As shown in FIG. 2D, as a result of the solution 23 drying from one end of the channel toward another end thereof, the semiconductor organic molecules 11 that have been solved in the solution 23 are oriented in parallel with the developing direction of drying of the solution and grow in the channel 12. In other words, the highly oriented semiconductor organic molecular crystals 11 can be arranged in the channel 12.

Figure 2E:
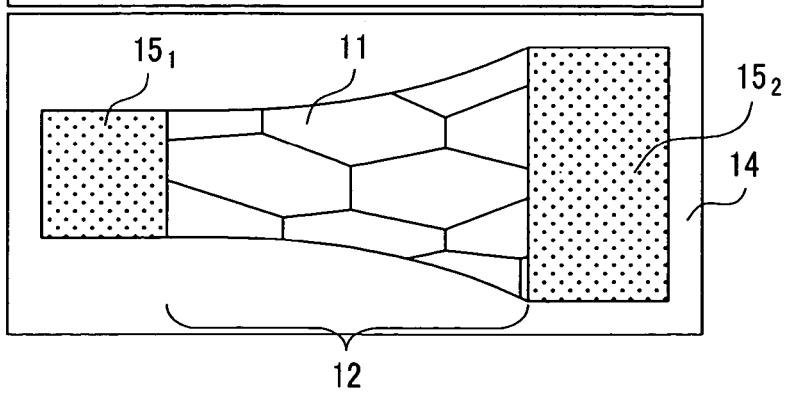

As shown in FIG. 2E, the metal thin films $15_1$ and $15_2$ that form the source and drain electrodes $15_1$ and $15_2$ are formed at both end portions of the semiconductor organic molecular crystal thin film 11 that grows from the solution that has been dried in the regions corresponding to the source and drain electrodes $15_1$ and $15_2$. A metal thin film is formed on the semiconductor organic molecular crystal thin film 11, thereby making it possible to make an electric contact of the channel 12 with the source and drain electrodes $15_1$ and $15_2$ excellent. This does not damage the adhesion property of the source and drain electrodes $15_1$ and $15_2$. It is unnecessary that the entire regions of the metal thin films $15_1$ and $15_2$ are superimposed on the semiconductor organic molecular crystal 11, and has such an area that good electric connection can be obtained is sufficient.

Figure 3A:
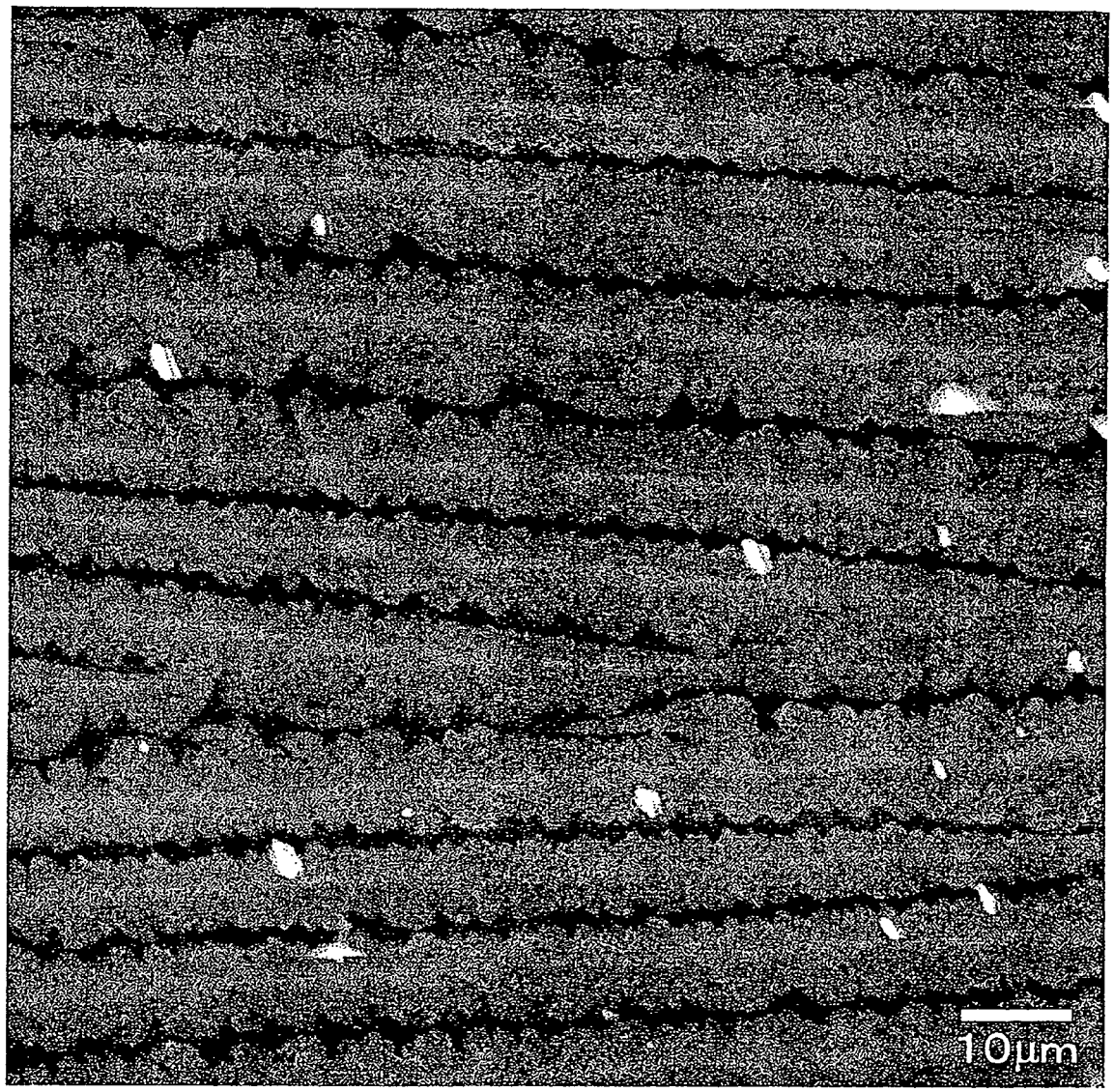
FIG. 3A is a picture showing a topographic AFM image of pentacene crystals largely grown along a drying direction of a solution, which results from anisotropic drying of the semiconductor organic molecule solution.
Figure 3B:
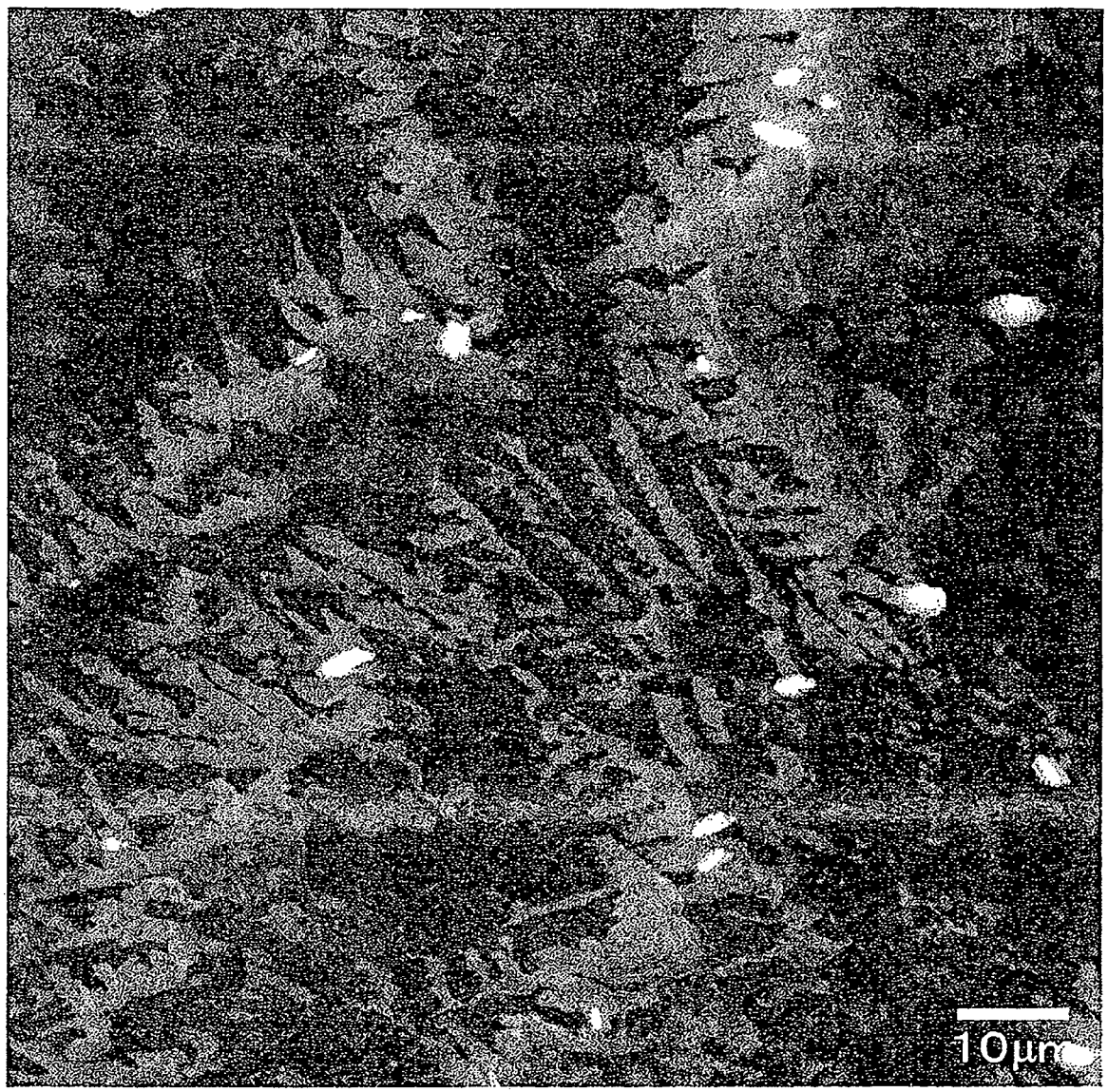
FIG. 3B is a picture showing a topographic AFM image of pentacene crystal in the case where drying of solution is not anisotropic enough to orient the crystal.

FIG. 3A shows an atomic force microscope (AFM) image of the pentacene crystal which has been produced in the anisotropic drying process of the liquid containing the semiconductor organic molecules according to this embodiment. The grains are oriented from right toward left which is the liquid drying direction, and greatly grows. FIG. 3B shows an AFM image of the pentacene crystal that grows in the case where the liquid drying direction is not sufficiently anisotropic by way of comparison.

Second Embodiment

Figure 4:
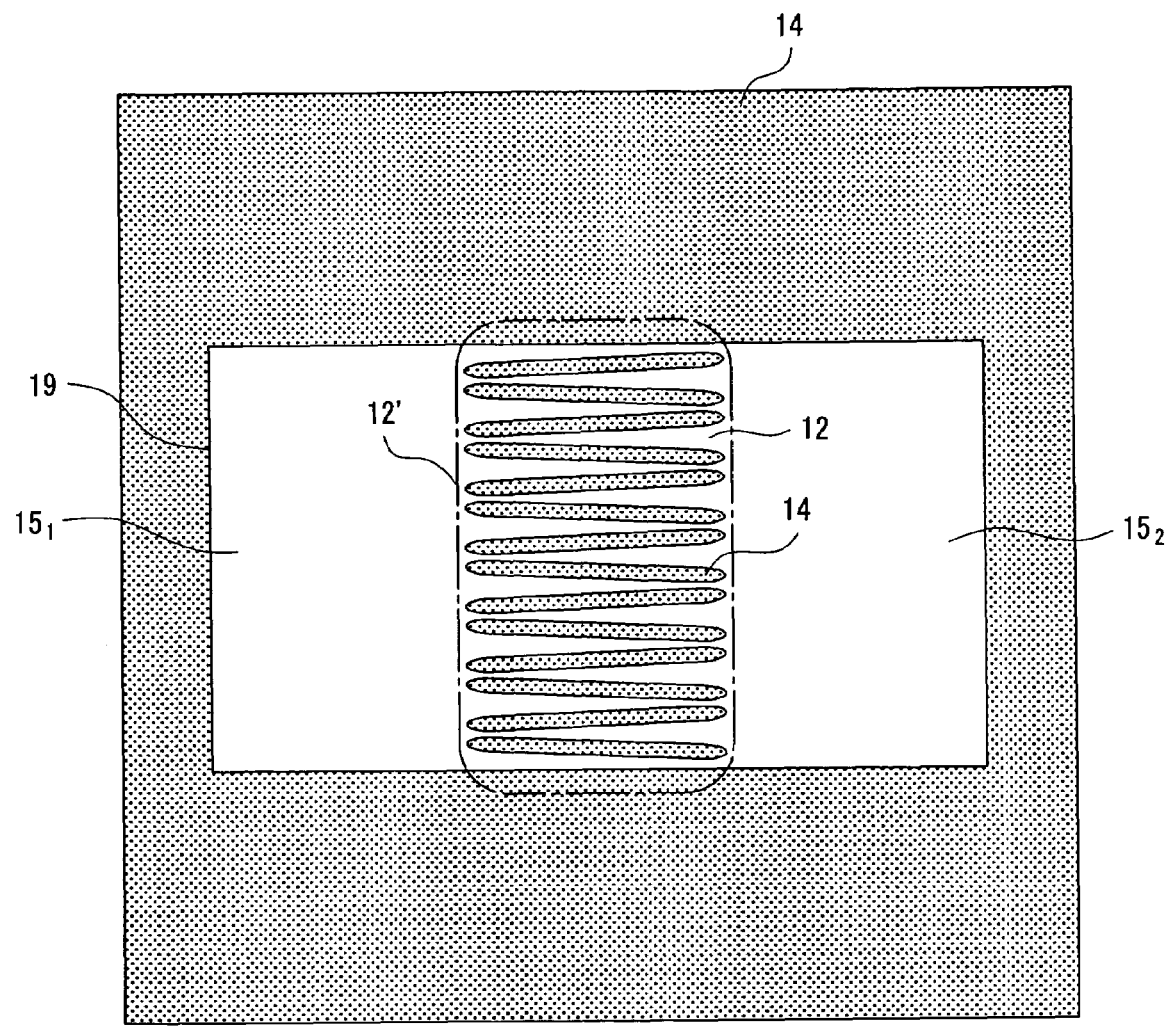
FIG. 4 is a plan showing an example in which one channel is structured by plural sub-channels whose widths change along a channel direction, and whose longitudinal axes are substantially in parallel with each other.

FIG. 4 is a plan schematically showing a second embodiment in which plural channels 12 are formed on the substrate by combination of plural regions that are arranged in parallel with the drain electrodes $15_1$ and $15_2$. An example of FIG. 4 is identical with the first embodiment in that the lyophilic region 19 is disposed in the lyophobic region 14, and the channel 12 and the source and drain electrodes $15_1$ and $15_2$ at both sides of the channel 12 are formed in the lyophilic region 19. However, the example of FIG. 4 is different from the first embodiment in that the plural channels 12 that change their widths along the longitudinal axial direction as in the first embodiment are formed in parallel with the channel region 12'. The channel region 12' is not entirely formed by the lyophilic region, but formed by having plural rectangular lyophobic regions 14 remaining which are narrower in the width and mutually inclining by a given angle. Therefore, the plural lyophilic regions that change their widths along the longitudinal axial direction are formed in parallel between the adjacent rectangular lyophobic regions 14.

Therefore, when the solution of the semiconductor organic molecules is supplied onto the substrate, the solution remains in the lyophilic region 19, the solution is dried in an anisotropic fashion, and the semiconductor organic molecular crystal thin film that is oriented in the longitudinal axial direction in the respective lyophilic regions is formed to constitute the channel 12 at a position corresponding to the lyophilic region which changes the width along the longitudinal direction between the rectangular lyophobic regions 14 adjacent to the channel region 12'.

According to the above example, since it is possible to effectively thicken the channel width, and the solution is dried in the anisotropic fashion with an effective structure, the semiconductor organic molecular crystal thin film that is excellent in the quality and oriented in the longitudinal axial direction can be formed. This has the advantage that a current driving force is increased by a single TFT.

Third Embodiment

FIGS. 5A to 5E are diagrams showing specific examples in which the TFT according to the present invention is made of an inorganic material except for the semiconductor organic molecular crystal thin film of the channel, and has a structure having the channels 12 shown in FIG. 4. In each of FIGS. 5A to 5E, the left side shows a cross-sectional view, and the right side shows a plan.

Figure 5A:
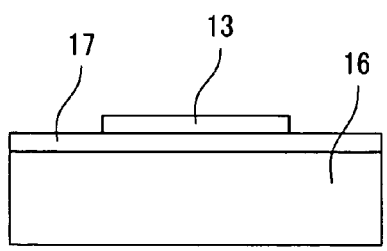
FIGS. 5A, 5B, 5C, 5D, and 5E are illustrations showing formation process of a TFT of the present invention in the case where the TFT is made of inorganic material except for a channel thereof.

As shown in FIG. 5A, a gate electrode 13 is formed on a silicon substrate 16. For that reason, a thermally oxidized film 17 is formed on the silicon substrate 16, and an aluminum thin film that is 30 nm in the thickness is formed on the thermally oxidized film 17 by sputtering vapor deposition to provide the gate electrode 13. The size of the gate electrode 13 corresponds to 500 μm in the channel length and 500 μm in the channel width.

Figure 5B:
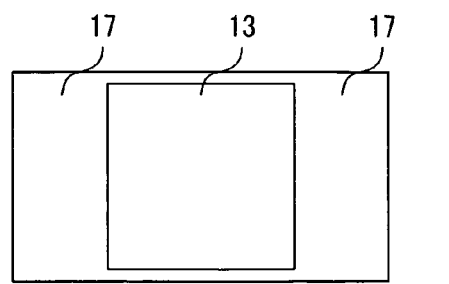
Figure 5B:
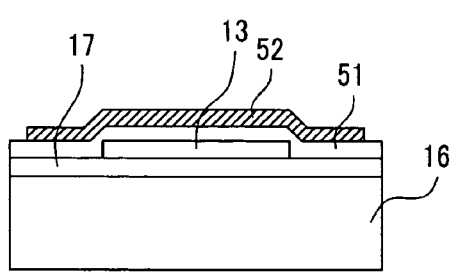

Then, as shown in FIG. 5B, an oxide silicon insulating film 51 that is 20 nm in the thickness is formed on the gate electrode 13 by sputtering vapor deposition. In addition, a resist is spin-coated to form a resist film 52. A reverse pattern of the channel pattern of the channel region 12' shown in FIG. 4 is formed on the resist film 52 by using a conventional positioning method that is used in photolithography. In this example, since the size of the gate electrode 13 correspond to 500 μm in the channel length and 500 μm in the channel width, the narrower width of the channel is set to 50 μm, and the entire channel is set to 500 μm in the width. The lyophobic region 14 that divides the channel into plural regions is alternately inclined by about ±6° with respect to the horizontal direction.

Figure 5C:
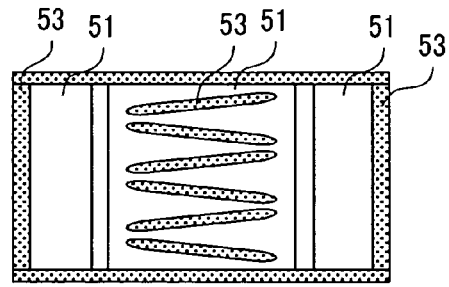
Figure 5C:
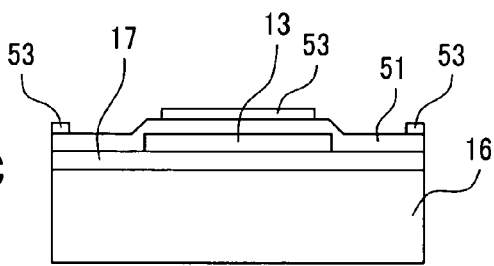

Then, as shown in FIG. 5C, a silane coupling agent with fluorinated alkyl chain is coated for formation of a lyophobic film 53. In the third embodiment, the silane coupling agent with fluorinated alkyl chain that is diluted to 0.1 wt % with solvent perfluoro octane (Daikin Industry Ltd., trade name: Optool) is spin-coated. In this state, the substrate is immersed in the acetone to remove the resist, to thereby conduct the liftoff of the lyophobic film 53, and the lyophobic pattern that coincides with the channel 12 in the position and the configuration, and the lyophobic film 53 that prevents the flow of the solution to the external of the source and drain electrodes are formed. Since the lyophobic film 53 of the channel region 12' is alternately inclined by about ±6° with respect to the horizontal direction, the lyophobic film 53 is cut along the way depending on the positions of the cross section, and the lyophobic film 53 is indicated in a manner that the lyophobic film 53 is taken along the center position of the lyophobic film 53 to avoid complications.

Figure 5D:
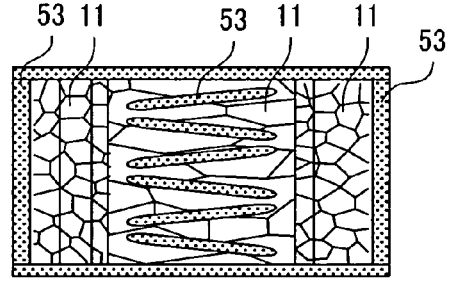
Figure 5D:
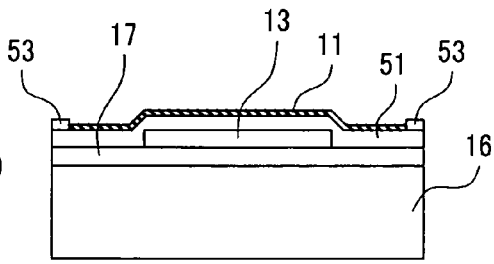

Then, the solution of the semiconductor organic molecules is supplied to the channel under the nitrogen atmosphere by means of a jetting mechanism including a nozzle position control mechanism, a solution jetting amount control mechanism, and a solution heating mechanism. In the third embodiment, DMSO (dimethyl sulfoxide) is used as the solution, and pentacene is diffused by 0.1 wt %, heated to 150° C., solved, and used as the solution, as disclosed in Japanese Journal of Applied Physics, Vol. 43, No. 2B, page 315 (2004). The solution is supplied by 3μ litters through a nozzle. In order to prevent the crystal growth in the solution due to a rapid reduction in the temperature of the solution, it is preferable to heat the substrate to about 120 to 130° C. The supplied solution is dried in an anisotropic fashion along the longitudinal axial direction of the channel to form the semiconductor organic molecule crystal thin film 11 that is oriented in the longitudinal axial direction, as shown in FIG. 5D. It is desirable that the process subsequent to the semiconductor organic molecular crystal film formation is conducted under nitrogen gas or inert gas atmosphere until a protective film is formed in order to prevent the oxidation of the semiconductor layer.

Figure 5E:
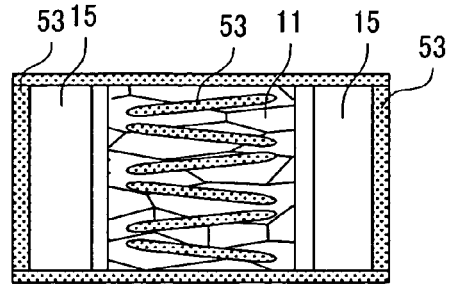
Figure 5E:
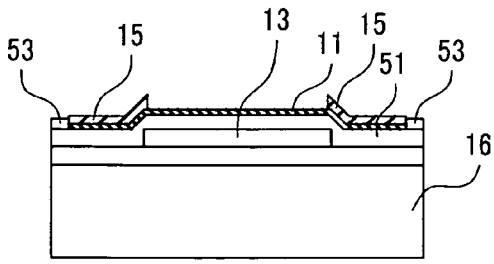

After the solution that remains in the region corresponding to the source and drain electrodes has been dried, as shown in FIG. 5E, a metal thin film 15 is formed in order to form the electrode. In the third embodiment, an electrically conductive ink is coated on the region corresponding to the source and drain electrodes and then baked, to thereby form the metal thin film 15. The conductive ink that is dropped on the source and drain electrode portions does not flow into the channel because of the gain of the surface energy. Also, the conductive ink does not flow to the outside of the electrode portions due to the lyophobic film 53 that has been already formed (FIG. 5C).

The conductive ink can be a liquid which contains at least one of metallic nanoparticles, metal complexes, and conducing polymers, which have the characteristic that the liquid spreads on the lyophilic region of the sourced/drain electrode portions, and which exhibits a sufficiently low resistance after baking. As the specific material, there can be used a solution in which metallic nanoparticles that are about 10 nm in the diameter and mainly contains gold, silver, palladium, platinum, copper, or nickel, or metal complexes are dispersed in a solvent such as water, toluene, xylene, or other organic solvent. In the third embodiment, silver nanoparticles dispersed aqueous solution are used. After the conductive ink has been dropped as much as the source and drain portions are sufficiently coated with the conductive ink, the conductive ink is baked in vacuum at 120° C. for 30 minutes to form an electrode that is about 100 nm in the thickness. Even in the case of using another conductive ink, the ink can be baked at an appropriate temperature of about 80 to 300° C. according to the kind of ink.

As described above, in the third embodiment, there can be structured the TFT that is structured as the assembly of the plural channels which are narrower in the width at the channel portions of the channel 12 exemplified in FIG. 4.

The lyophobic film 53 is not necessary for the respective TFTs when the plural TFTs are contiguously arranged, and may be disposed for the entire contiguously arranged TFTs.

Fourth Embodiment

FIGS. 6A to 6F are diagrams for explaining specific examples of constructing the TFT in an inexpensive method such as printing or coating which does not depend on the lithography, by using a material having the flexibility for the substrate and the insulting film in the TFT according to the present invention. A left drawing of FIG. 6 is a diagram of a section of the right drawing taken along an arrow direction at a position B-B'.

As shown in FIG. 6A, a gate electrode 62 of a pattern shown in FIG. 4 is printed on a plastic substrate 61 by using a conductive ink. The pattern of the gate electrode 62 is a region (a reverse pattern of the channel pattern of the channel region 12' shown in FIG. 4) except for a region corresponding to the lyophobic region 14 in the channel region 12' of FIG. 4. The substrate is baked to form a metal electrode 62. Because the substrate is made of plastic, attention must be paid to the softening temperature of the plastic. In the fourth embodiment, the substrate 61 is formed of a high transparent polyimide sheet that is 100 μm in the thickness, and a baking temperature can increase up to about 250° C. For that reason, the substrate 61 can sufficiently withstand 120° C. of the baking temperature required when the conductive ink is made of water dispersion of silver nanoparticles.

Polymethylmethacrylate (PMMA) is spin-coated on the gate electrode 62, and sufficiently dried to form a gate insulating film 63. In this example, the gate insulating film 63 is dried at 100° C. for 10 minutes by using a hot plate. In addition, a photosensitive thin film 64 is formed. In the fourth embodiment, a positive resist is spin-coated to obtain a film that is 100 nm in the thickness.

Then, in order to form regions corresponding to the source and drain electrodes and the lyophobic region 14 of the gate electrode portion shown in FIG. 4, the lyophobic pattern is formed. The silane coupling agent with fluorinated alkyl chain as in the third embodiment is spin-coated, and the surface of the plastic substrate 61 is irradiated with ultraviolet light by a mercury lamp as indicated by an arrow in the sectional view of FIG. 6B (FIG. 6B). Since ultraviolet light necessary for exposure of the photosensitive coating film used in the fourth embodiment is i-line having a wavelength of 365 nm, it is desirable that ultraviolet light having a wavelength of 300 nm or lower is cut by a filter in order to prevent the gate insulating film 63 (polymer film—PMMA film) from being damaged. Because the metal electrode film 62 has been already formed on the gate electrode portion, the irradiated ultraviolet light cannot pass through the region corresponding to the channel 12, and the photosensitive thin film is exposed in only the region corresponding to the lyophobic region 14 of the gate electrode portion and the source and drain electrode portion. After irradiation for about 30 seconds, the photosensitive thin film is developed to remove a region corresponding to the lyophobic region 14 of the gate electrode portion and the photosensitive thin film 64 of the source and drain electrode peripheral portion, and a lyophobic film 65 of that region is lifted off (FIG. 6C).

Metal films 66 are formed on regions corresponding to the source and drain electrodes $15_1$ and $15_2$ and the lyophobic region 14 of the gate electrode portion through the same method as that in the third embodiment (FIG. 6D). Again, a silane coupling agent with fluorinated alkyl chain is spin-coated to form a lyophobic film as in the third embodiment. The resist 64 is removed by using a solvent of the photosensitive thin film, as a result, only a region 67 corresponding to the lyophobic region 14 of the gate electrode portion and the source and drain electrode peripheral portion develops the lyophobic property. In this embodiment, acetone is used as the photosensitive thin film solvent.

The formation of the channel 12 made of the semiconductor organic molecules is conducted in the same manner as that of the third embodiment. In this way, a layer 68 of the semiconductor organic molecules is formed in the lyophilic region, and the TFT having the flexibility can be constituted by an inexpensive method such as printing and coating using no lithography.

In the fourth embodiment, the substrate is made of polyimide, and the insulating film is made of PMMA. As other cases, the substrate may be formed of various flexible plastic substrates including polyvinyl phenol, and the insulating film may be made of polyimide or polyvinyl phenol without any problem. Also, in the case where no flexibility is required, the substrate is formed of an inorganic insulating film, thereby making it possible to take the advantage that options of the manufacturing process such as printing and coating are increased. After the gate electrode is formed, the insulating film is formed by spin-on-glass (SOG), the positive resist is spin-coated, and the rear surface of the insulating film is irradiated with ultraviolet light by using a mercury lamp. Because the resist other than that of a region shielded from ultraviolet light by the gate electrode is solved and removed by development, the resist pattern is the same pattern as that of the gate electrode. In this state, the silane coupling agent with fluorinated alkyl chain is spin-coated. Subsequently, the resist is removed by using acetone to lift off silane coupling agent with fluorinated alkyl chain and obtain a desired lyophobic pattern. In this method, since a heat treatment of about 450° C. is required for baking SOG, and the organic solvent is used for removal of the resist, this method cannot be used in the case where the substrate or another member is made of organic material. This method has the advantages that the number of procedures of the manufacture process is reduced, and no metal is required for formation of the lyophobic film.

In addition, when plural TFTs are contiguously arranged, the metal film 63 is not required for each of the TFTs, and the metal film 63 can be provided for the entire TFT contiguously arranged.

Other Embodiments

In FIG. 2, because the width of the lyophilic pattern 19 that constitutes the channel 12 changes in a direction of connecting the source and drain electrodes $15_1$ and $15_2$, the direction of the crystal orientation of the semiconductor organic monocular crystal is also directed toward the same direction. However, the present invention is not limited to this configuration. For example, by changing the channel configuration in a direction perpendicular to a direction along which the carriers flow in the channel, a direction perpendicular to the carrier conducting direction can be set as the main orienting direction of crystal. Likewise, it is possible to grow crystal having a main orientation in an arbitrary direction with respect to the carrier conducting direction in the channel.

It is unnecessary that the pattern of the lyophilic region is limited to such a configuration that the width of the channel is monotonously changed toward one direction as shown in FIGS. 1 and 2. There is required such a pattern that the solution that is supplied to the lyophilic region spontaneously induces the anisotropic drying toward the longitudinal axial direction of the lyophilic pattern. In order to meet the above requirement, the object is achieved when the width in the shorter axial direction is averagely widened with respect to a desired direction among the longitudinal axial directions of the lyophilic pattern.

Alternatively, the following configuration can be applied. The source and drain electrodes that are formed on the substrate and the region corresponding to the channel that connects those electrodes to each other are so formed as to be lower than the peripheral portion, and the peripheral portion is set in the lyophobic region. A solution containing the organic molecules therein is supplied onto the substrate, and the solution supplied in the source and drain electrode direction is dried in the anisotropic fashion. The organic molecules in the solution is oriented in a region corresponding to the channel and made to grow.

Also, the supply of the semiconductor organic molecule solution is not limited to the method using a nozzle which is represented by the above micropipette, but a method using an ink jet printer disclosed in, for example, Japanese Patent Laid-Open No. 2003-229579, Japanese Patent Laid-Open No. 2003-133691, or Japanese Patent Laid-Open No. 2003-80694 is applicable to the supply of the semiconductor organic molecule solution. Also, as a method of forming the electrode or the wiring, a manufacturing method using a so-called direct drawing method such as ink jetting, plating, and printing as disclosed in, for example, Nikkei Electronics, Jun. 17, 2002, pp. 67-78 has been actively studied in recent years. There can be expected the advantage that an electric circuit including an electronic element can be formed inexpensively as compared with the conventional method using photolithography by combination of those techniques with the technique of the present invention.

In the third embodiment, the gate electrode material is made of aluminum, but may be made of a metal that is stable and excellent in the electric conductivity under the atmosphere, for example, gold, silver, platinum, palladium, copper, nickel, and iron. Also, in the third embodiment, each of the substrate and the insulating film is made of silicon with an oxide film, or thermally oxidized silicon. However, the present invention is not limited to this structure. In order to prevent a leak current between the respective electrodes, it is desirable that the substrate is made of a material high in the insulating property. Also, the silane coupling agent with fluorinated alkyl chain is used as a lyophobic film material, but another material may be used if at least a part of the material has the lyophobic molecules having a carbon chain terminated with fluorine group. For example, an oxetane derivative such as perfluorooxetane having fluorine substituent at a side chain is applicable. As another material, a lyophobic film not depending on a fluorine surface active agent can be also used. In this case, such an advantage that the options increase is obtained, but the lyophobic property has a tendency to be deteriorated with respect to the semiconductor organic molecule solution.

In the second embodiment, in order to facilitate the spontaneous and anisotropic drying of the solution which is used in the formation of the channel, the channel portion of the TFT and the pattern of the source and drain electrode portion are featured. Alternatively, there is a method of controlling the drying process not depending on the feature of the pattern.

Figure 7:
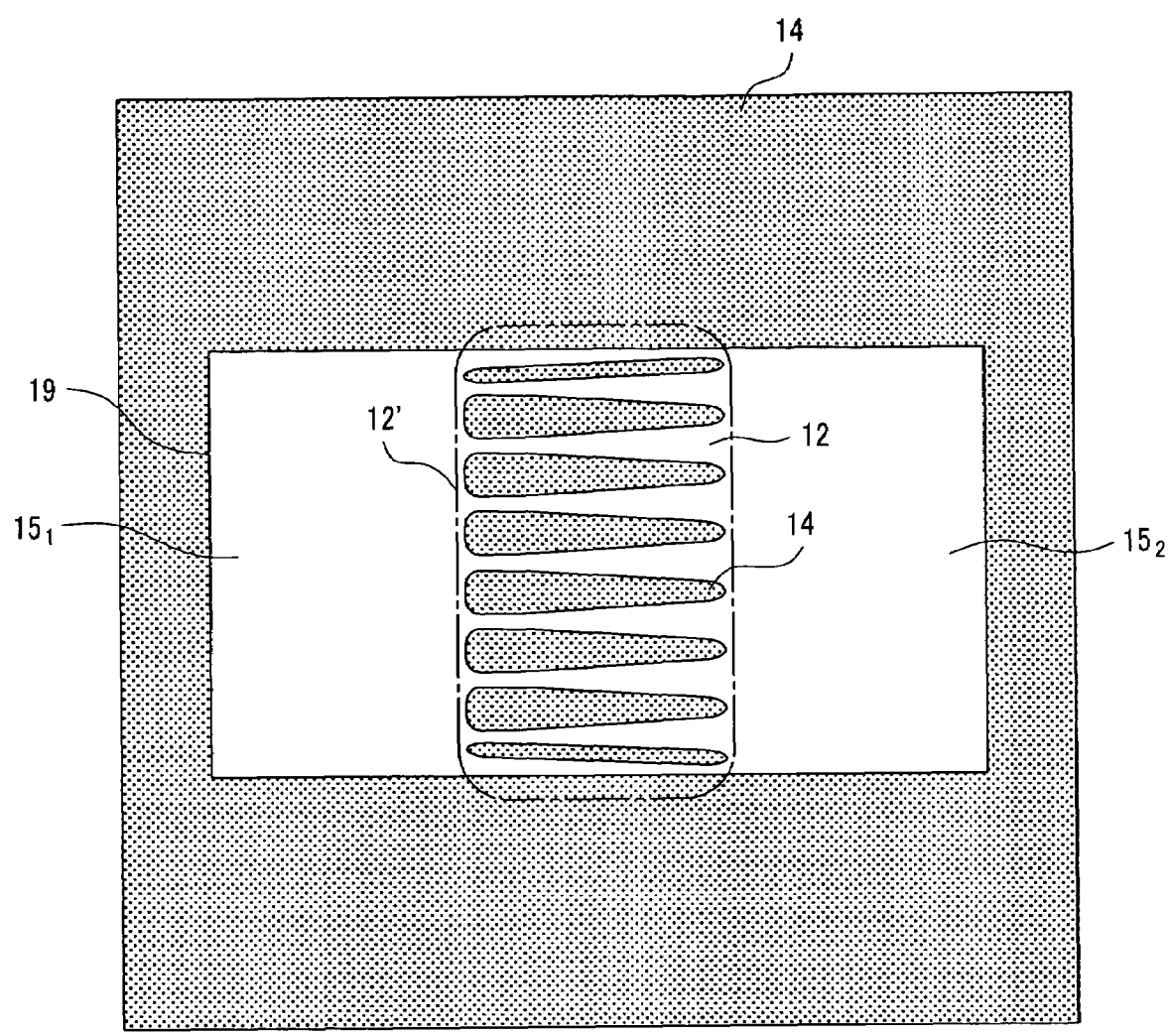
FIG. 7 is a plan showing a channel 12 consisting of narrow sub-channels of which widths change along the same direction.

For example, when the channel direction of the FET on the substrate is arranged in such a manner that all of changes in the width are directed in the same direction along the longitudinal direction, differently from FIG. 4, a dip method or a method using a temperature gradient or gas blowing can be used. FIG. 7 shows an example in which the channels of the FET have the changes of widths directed in the same direction along the longitudinal direction in the configuration corresponding to FIG. 4. The dip method is a method in which the substrate is immersed in the solution containing the semiconductor organic molecules therein, and then pulled out in the longitudinal direction of the channel, which has the feature that it is unnecessary to supply the solution to the individual TFTs, respectively, and the productivity is excellent. In the method depending on the temperature gradient, the substrate is placed flatly, and different temperatures gradient are given to both ends of the substrate or both ends of the channel so that the temperature gradient is given in the channel longitudinal direction. This method is advantageous in that the drying speed increases in the case of using the solution that is difficult to dry. In the method of blowing gas, gas is blown toward the channel longitudinal direction by means of an air gun after the supply of the solution to control the drying direction. This method can be used in the case of using a material that is difficult to heat or in the case where the substrate needs to be heated, thereby making it difficult to give the temperature gradient. As another method, it is possible to conduct a desired drying process on the semiconductor organic molecule solution by giving a gradient to the lyophobic property within the interior of the pattern. The gradient of the lyophobic property can be performed, for example, by controlling an ultraviolet radiation amount. This method can be used even in the case where the channels of the FET on the substrate are not directed toward the same direction. In all of those methods, the TFT region needs to be patterned with lyophilic and lyophobic portions, but the configuration of the pattern does not need to be featured, and the orientation of the semiconductor organic molecular crystal thin film can be improved with respect to an arbitrary pattern as the TFT pattern.

In the third embodiment, the conductive ink is employed in the formation of the source and drain electrodes, and it is necessary to keep the baking temperature of the conductive ink to about 250° C. for the purpose of preventing the decomposition of molecules or sublimation because the organic molecules are used for the channel. As the source and drain electrode forming method, a method using lithography is also applicable. In this case, it is necessary to protect the channel portion 12' with a resist, and care needs to be taken not to damage the organic molecules that constitute the channel portion 12' at the time of removing the resist after the formation of the electrode.

In the third embodiment, the formation of the channel is conducted prior to the formation of the source and drain electrodes. This configuration has the advantage that a contact of the semiconductor organic molecular crystal that forms the channel with the electrode metal is excellently kept. However, it is possible to form those electrodes before the formation of the channel. In this case, there is an advantage in that the normal lithography method can be applied not taking an influence on the channel. Also, even in the case where the electrode is formed by baking the conductive ink, there is an advantage in that the baking temperature can be set to be equal to or higher than the decomposition temperature of the organic molecules.

(Applied Example of the Invention)

A description will be given of the manufacture of a pixel unit of an active matrix display element that uses the TFT of the present invention for a driver circuit.

Figure 8A:
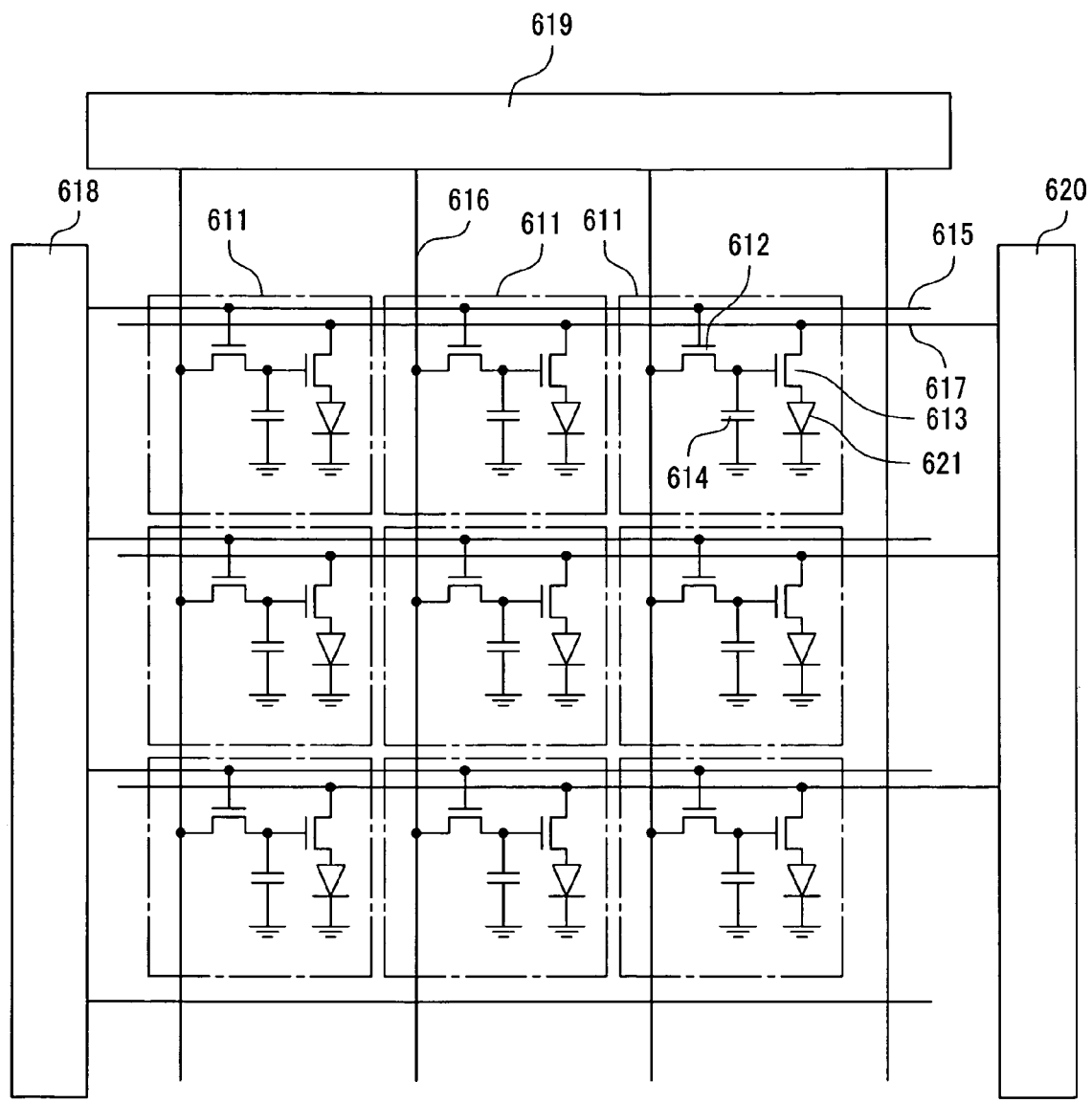
FIG. 8A shows an equivalent circuit for 3×3 pixels of an active matrix display device which uses TFTs of the present invention in a driver circuit.

FIG. 8A is an equivalent circuit diagram of an active matrix display element of a pixel unit of 3×3 in which the TFT of the present invention is used for a drive circuit. The drive circuit of an organic electroluminescence element is incapable of using a liquid crystal display pixel drive circuit as it is, and requires one extra TFT for current control as compared with liquid crystal display pixel drive circuit, for example, as disclosed in Nikkei Electronics Apr. 24, 2000, pp. 163-167. In this applied example, a description will be given of a display element having a drive circuit that two TFTs per one pixel as disclosed in Nikkei Electronics Apr. 24, 2000, pp. 163-167 and Japanese Patent Laid-Open No. 2003-316295.

Reference numeral 618 denotes a scanning line drive circuit that supplies a signal to scanning lines 615 in a given cycle. Reference numeral 619 denotes a data line drive circuit which supplies an image data signal to data lines 616. Reference numeral 620 is a current supply circuit which supplies a current to current supply lines 617 in the same cycle as that of the scanning lines 615. Reference numeral 611 denotes pixel units that are selectively driven by those circuits. Each of the pixel units 611 is constituted by a pixel 621 and a pixel control circuit. The pixel control circuit is made up of a select TFT 612, a current control TFT 613, a capacitor 614, and related lines. Even in the case of the display that is larger in the number of pixels can be accepted by increasing the number of pixel units because of the active matrix type.

Figure 8B:
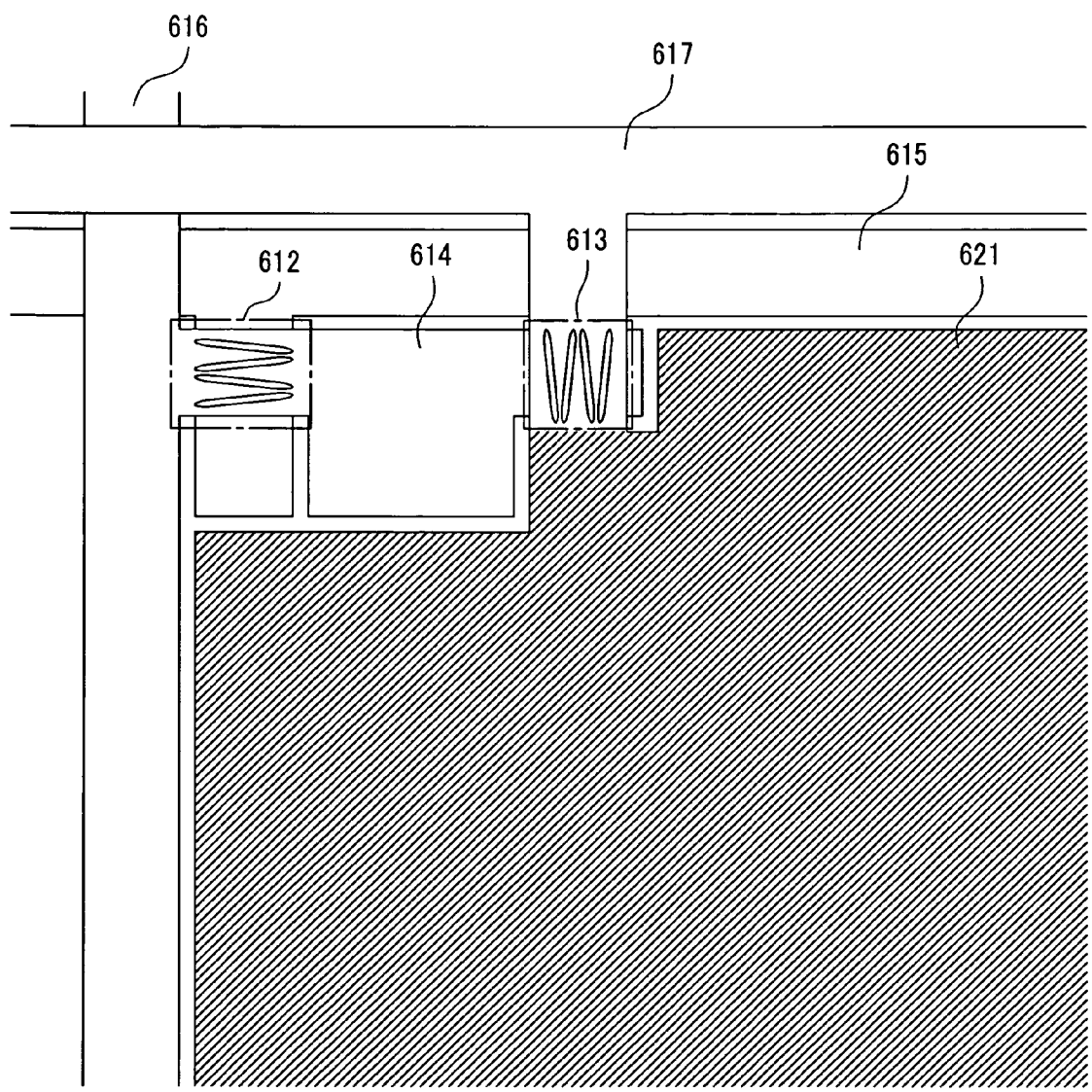
FIG. 8B shows an example of the construction of the pixels shown in FIG. 8A.

FIG. 8B is a diagram showing a specific structural example of the pixel units 611 shown in FIG. 8A. The manufacturing method is identical with the method using the inorganic insulating substrate disclosed in the fourth embodiment. The outline will be described below.

First, a metal wiring having a pattern of the scanning lines 615 is printed and formed on a glass substrate. The wiring width is set to 60 μm. Because the scanning lines 615 also serve as the gate electrodes of the select TFT 612, a gate electrode pattern for forming the channel pattern of the select TFT 612 is disposed at a given position as described in the third and fourth embodiment. In the applied example, the channels of the select TFT 612 and the current control TFT 613 are identical with those in the third embodiment, and the channel is constituted as the assembly of plural regions as shown in FIG. 4. The channel width of the narrower channel is set to 10 μm, and the channel length and the channel width are set to 60 μm, respectively. After the insulating film has been formed by SOG, the wiring pattern of the data lines 616 is produced prior to the channel formation of the select TFT 612.

In the applied example, a mask is employed so that a resist remains on the reverse pattern of the data lines, and an upper surface is exposed. Care is taken to make the resist remain in a region corresponding to the channel of the select TFT 612 so that no metal is formed on that region. The data line 616 also serves as the gate electrode of the current control TFT 613, and the channel pattern of the current control TFT 613 is formed on a part of the data line pattern as in the formation of the select TFT 612. After development, the data lines 616 are formed by using the conductive ink. Because the conductive ink using silver nanoparticle which is used in the applied example is 120° C. in baking temperature, it is possible to remove the resist that remains after baking.

After the resist has been removed by using acetone, the positive resist is again spin-coated, and the substrate is exposed to ultraviolet light from the rear surface in order to form latent image of the channel of the select TFT 612. The resist film is developed and then spin-coated with silane coupling agent with fluorinated alkyl chain. The residual resist is removed by acetone, and a lyophobic film is formed on a region except for the scanning lines and the data lines 616. The channel forming method of the select TFT 612 is identical with the method described in the third embodiment.

Thereafter, the formation of the insulating film due to SOG, and the current supply lines 617, the counter electrodes 621, and the current control TFTs 613 are formed in the same manner. The SOG for formation of the insulating film uses catalyst so as not to affect the semiconductor layer, and the baking temperature is suppressed to 300° C. or lower. A photosensitive polyimide is coated on the uppermost layer, and the upper surface is exposed in a state where the counter electrode region is masked. Thereafter, the polyimide film is developed and baked, thereby making it possible to define through holes in the protective film and the counter electrode region. Thereafter, an EL film is formed on the pixel region through a method disclosed in, for example, Japanese Patent Laid-Open No. 2004-47494, an ITO film is formed by using a photosensitive ITO coating as an upper electrode, thereby making it possible to form pixels and a drive circuit therefor. In addition, the scanning line drive circuit 618, the data line drive circuit 619, and the current supply circuit 620 are appropriately formed, thereby making it possible to constitute an active matrix display element.

In this applied example, the manufacturing method using printing or coating is applied such that SOG is used in the formation of the insulating film, and the conductive ink is used in the formation of the data lines 616 and the current supply lines 617. This method can be replaced by the film forming method in vacuum which is used in the conventional semiconductor LSI manufacturing process. The use of the conventional semiconductor LSI manufacturing process is advantageous in that the respective wiring patterns can be positioned with precision.

On the other hand, it is possible to form the respective wiring patterns through the printing method using a coating technique for the ink jet. In this case, it is possible to conduct all of the manufacturing processes through the printing and coating method with the result that the manufacture costs can be remarkably reduced. Also, the manufacture steps are also remarkably reduced. In the case of using the print/coating method, the positioning error of the respective wiring patterns becomes larger than that in the lithography method, but the positioning error which is required by the pixel element control circuit is greatly relieved as compared with the positioning error that is demanded by a logic circuit. Therefore, about 30 μm of the positioning error in the ink jet is permitted except for the TFT region. In the TFT region, because the pattern formed in the wiring of the lower layer is used for the channel formation, the TFT region of the upper-layer wiring must be located at the channel pattern position of the lower-layer wiring in the third embodiment. The positioning precision is to the degree that the displacement of about several μm at maximum is permitted in the case where the channel width is about 60 μm in the third embodiment. However, the above problem can be prevented by providing the extra width of the channel patterns carved in the lower-layer wiring as compared with the naturally required width. Because the formed pattern does not greatly affect the function of the wiring, the primary wiring function does not suffer from any problem even if the extra channel pattern is provided.

According to the present invention, since the crystal of the semiconductor organic molecules that form the channel can be highly oriented in the required direction, it is possible to manufacture the TFT that is large in the carrier mobility. Also, in the present invention, since a liquid is used for the formation of the channel, and the manufacture can be performed through the coating method and the ink jet method, the TFT can be manufactured easily and inexpensively.

According to the present invention, it is expected that a flexible display device drive circuit can be formed by applying the above coating and printing technique by using the flexible substrate.

According to the present invention, there is provided the high-performance organic TFT in which the semiconductor organic molecule thin film that constitutes the channel is highly oriented.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A field effect transistor, comprising:
   a substrate;
   a lyophobic region formed over the substrate; and
   lyophilic regions corresponding to source and drain electrodes and a channel that connects both of the source and drain electrodes to each other, said lyophilic regions being formed in the lyophobic region, said channel including a crystal having a grain size larger in a longitudinal direction of said channel than in a width direction of said channel,
   wherein a width of said channel changes along the longitudinal direction of said channel, and said channel is sandwiched by the lyophobic region.

2. The field effect transistor according to claim 1, wherein a plurality of channels are formed between said source electrode and said drain electrode, and each of the plurality of channels includes a crystal having a larger grain size in the longitudinal direction of each channel than in a width direction of each channel,
   wherein a width of each channel changes along the longitudinal direction of each channel, and each channel is sandwiched by the lyophobic region.

3. A field effect transistor, comprising:
   an insulator;
   a lyophobic region formed on the insulator; and
   lyophilic regions corresponding to source and drain electrodes and a channel that connects both of the source and drain electrodes to each other, said lyophilic regions being formed in the lyophobic region, said channel including a crystal having a lager grain size in the longitudinal direction of said channel than in a width direction of said channel,
   wherein a width of said channel changes along the longitudinal direction of said channel, and said channel is sandwiched by the lyophobic region.

4. The field effect transistor according to claim 3, wherein a plurality of channels are formed between said source electrode and said and drain electrode, and each of the plurality of channels includes a crystal having a larger grain size in the longitudinal direction of each channel than in a width direction of each channel,
   wherein a width of each channel changes along the longitudinal direction of each channel, and each channel is sandwiched by the lyophobic region.

* * * * *